(12) United States Patent
Buvid et al.

(10) Patent No.: US 10,056,324 B2
(45) Date of Patent: Aug. 21, 2018

(54) TRACE/VIA HYBRID STRUCTURE WITH THERMALLY AND ELECTRICALLY CONDUCTIVE SUPPORT MATERIAL FOR INCREASED THERMAL AND ELECTRICAL PERFORMANCE

(71) Applicant: INTERNATIONAL BUSINESS MACHINES CORPORATION, Armonk, NY (US)

(72) Inventors: Daniel J. Buvid, Rochester, MN (US); Eric J. Campbell, Rochester, MN (US); Sarah K. Czaplewski, Rochester, MN (US); Christopher W. Steffen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/347,167

(22) Filed: Nov. 9, 2016

(65) Prior Publication Data

US 2018/0130734 A1 May 10, 2018

(51) Int. Cl.
*H05K 1/03* (2006.01)
*H01L 23/498* (2006.01)
*H01L 21/48* (2006.01)

(52) U.S. Cl.
CPC ...... *H01L 23/49838* (2013.01); *H01L 21/486* (2013.01); *H01L 23/49816* (2013.01); *H01L 23/49827* (2013.01); *H01L 23/49866* (2013.01); *H01L 23/49894* (2013.01)

(58) Field of Classification Search
CPC ............ H01L 23/49838; H01L 21/486; H01L 23/49816; H01L 23/49827; H01L 23/49866; H01L 23/49894

USPC ....... 174/255, 250, 251, 257–259, 261, 262; 29/829
See application file for complete search history.

(56) References Cited

U.S. PATENT DOCUMENTS

| | | |
|---|---|---|
| 5,939,781 A | 8/1999 | Lacap |
| 6,507,115 B1 | 1/2003 | Hofstee et al. |
| 6,753,600 B1 | 6/2004 | Ho |
| 7,274,105 B2 | 9/2007 | Fairchild et al. |
| 8,525,214 B2 | 9/2013 | Lin et al. |

(Continued)

OTHER PUBLICATIONS

Eyman, L.M. et al., "A Thermally Enhanced 2-Layer PBGA Substrate Design" IP.com No. IPCOM000009041D (Aug. 2006) pp. 1-2.

(Continued)

*Primary Examiner* — Tremesha S Willis
(74) *Attorney, Agent, or Firm* — Tutunjian & Bitetto, P.C.; Robert R. Williams

(57) ABSTRACT

A method of forming an interconnect that includes providing a sacrificial trace structure using an additive forming method and forming a continuous seed metal layer on the sacrificial trace structure. The sacrificial trace structure is removed, and the continuous seed metal layer remains. An interconnect metal layer is formed on the continuous seed layer, and an electrically insulating material layer is formed on the interconnect metal layer. An electrically conductive support material is formed to encapsulate a majority of the interconnect metal layer, wherein the ends of the interconnect metal layer are exposed through opposing surfaces of the electrically conductive support material to provide an interconnect extending through the electrically conductive support material.

14 Claims, 5 Drawing Sheets

(56) References Cited

U.S. PATENT DOCUMENTS

| | | |
|---|---|---|
| 8,557,639 B2 | 10/2013 | Pagaila et al. |
| 2005/0139980 A1 | 6/2005 | Burns |
| 2010/0006330 A1* | 1/2010 | Fu .................. H01L 21/486 |
| | | 174/260 |
| 2014/0048313 A1 | 2/2014 | Pan et al. |
| 2015/0270192 A1 | 9/2015 | Bar et al. |
| 2016/0029476 A1 | 1/2016 | Schmalenberg et al. |

OTHER PUBLICATIONS

Disclosed Anonymously "Method for a stacked-package thermal solution for wireless devices" IP.com No. IPCOM000137900D (Jun. 2006) pp. 1-4.

* cited by examiner

TRACE/VIA HYBRID STRUCTURE WITH THERMALLY AND ELECTRICALLY CONDUCTIVE SUPPORT MATERIAL FOR INCREASED THERMAL AND ELECTRICAL PERFORMANCE

BACKGROUND

Technical Field

The present invention generally relates to interconnect structures, and more particularly to forming electrically conductive lines having orthogonal portions and curvatures extending through dielectric structures.

Description of the Related Art

Copper wires and interconnects typically seen in printed circuit board (PCBs), interposers and package substrates. An interposer is a form of interconnect that is placed between a printed circuit board (PCB) and a processor. As chips continue to scale, chips become denser requiring a higher pin count for the input/output (I/O). An interposer is used to spread a connection to a wider pitch or to re-route to a different connection. In conventional interconnect structures that extend through a substrate, the metal lines are limited to being straight.

SUMMARY

In one embodiment, a method of forming an interconnect is described herein that includes providing a sacrificial trace structure using an additive forming method, in which the sacrificial trace structure has a geometry for the interconnect. The method continues with forming a continuous seed metal layer on the sacrificial trace structure; and removing the sacrificial trace structure, in which the continuous seed metal layer remains. An interconnect metal layer is formed on the continuous seed layer. An electrically insulating material layer is formed on the interconnect metal layer, and an electrically conductive support material is formed to encapsulate a majority of the interconnect metal layer. The electrically insulating material layer isolates the interconnect metal layer from the electrically conductive support material. In some embodiments, ends of interconnect metal layer are exposed through opposing surfaces of the electrically conductive support material to provide an interconnect extending through the electrically conductive support material.

In another embodiment, a method of forming an interconnect is provided that includes providing a sacrificial trace structure using an additive forming method, the sacrificial trace structure having a geometry for the interconnect having at least one non-linear portion, and forming a continuous seed metal layer on the sacrificial trace structure. The sacrificial trace structure is then removed, wherein the continuous seed metal layer remains. An interconnect metal layer is formed on the continuous seed layer, in which the interconnect metal layer includes the at least one non-linear portion. An electrically insulating material layer is formed on the interconnect metal layer, and an electrically conductive support material is formed to encapsulate a majority of the interconnect metal layer. The electrically insulating material layer isolates the interconnect metal layer from the electrically conductive support material, in which the ends of interconnect metal layer are exposed through opposing surfaces of the electrically conductive support material to provide an interconnect having said at least one non-linear portion extending through the electrically conductive support material.

These and other features will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1A:
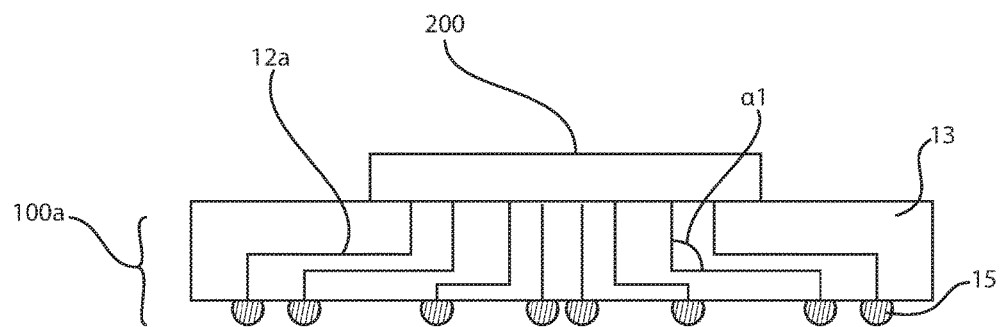
FIG. 1A is a side cross-sectional view depicting one embodiment of an interposer including metal based interconnect structure that includes orthogonal portions.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide interconnect structures, and more particularly provide for forming electrically conductive lines having curvatures and orthogonal portions through dielectric structures. Copper wires and interconnects typically seen in printed circuit boards, interposers and package substrates are typically limited to being manufactured in straight horizontal and vertical directions. In some embodiments, the methods and structures disclosed herein manufacture a copper trace, via, pad hybrid structure, including orthogonal and curved pathways. This can allow for shorter interconnect, lower latency and lower impedance in the electrical devices employing the structures and methods described herein. Additionally, if the support material is made of an electrically conductive material and then subsequently grounded, the signal integrity of all of the metal wires in the metal interconnect can be improved.

Figure 1B:
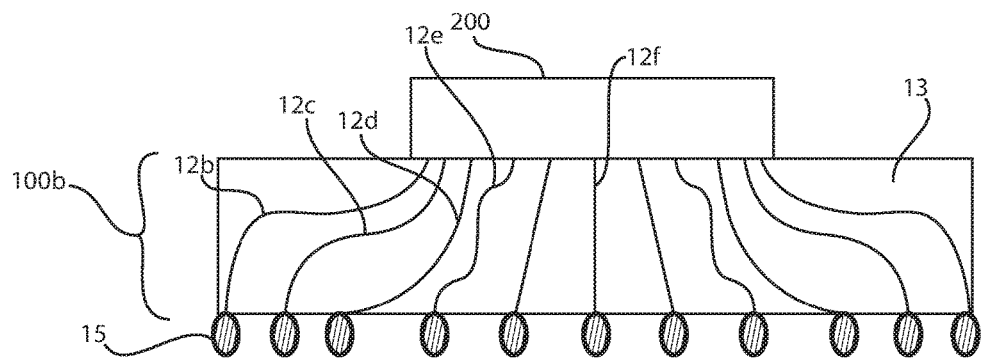
FIG. 1B is a side cross-sectional view depicting one embodiment of an interposer including metal based interconnect structures that include curveted portions.

FIGS. 1A and 1B illustrate some embodiments, of an interposer 100a, 100b which is one example of an interconnect structure within the scope of the present disclosure, that includes a metal based interconnect structure 12a, 12b, 12c, 12d, 12e. In some embodiments, the interposer 100a, 100b includes an electrically conductive and thermally conductive support material, i.e., body of electrically conductive support material 14, and a metal based interconnect structure 12a, 12b, 12c, 12d, 12e extending through the body of electrically conductive support material 14 from a first side of the electrically conductive support material to an opposing second side of the electrically conductive support material. At least one metal line of the metal based interconnect structure 12a, 12b, 12c, 12d, 12e extends from the first side of the di the body of electrically conductive support material 14 to the second side of the body of electrically conductive support material 14. Still referring to FIGS. 1A and 1B, in some embodiments, solder connections 15, e.g., solder bumps, may be present on opposing sides of the body of electrically conductive support material 14 on exposed surfaces of said metal based interconnect structure.

In some embodiments, the metal based interconnect structure 12a, 12b, 12c, 12d, 12e extends through the body of electrically conductive support material 14 and provide for electric communication across the interposer 100a, 100b from a first side of the interposer 100a, 100b that may be in electric contact with a microprocessor 200 to a second side of the interposer 100a, 100b. The second side of the interposer 100a, 100b may be in contact with a supporting substrate (not shown), in which the supporting substrate may include its own interconnect structure that is to be positioned in electrical communication with the metal based interconnect structure 12a, 12b, 12c, 12d, 12e of the interposer 100a, 100b.

The metal based interconnect structure 12a, 12b, 12c, 12d, 12e may be composed of any electrically conductive metal. "Electrically conductive" as used through the present disclosure means a material typically having a room temperature conductivity of greater than $10^{-8}(-m)^{-1}$. In some embodiments, the metal based interconnect structure 12a, 12b, 12c, 12d, 12e may be comprised of aluminum (Al), copper (Cu), tungsten (W), tantalum (Ta), platinum (Pt), gold (Au), silver (Ag), and other elemental metals. In other embodiment, the metal based interconnect structure 12a, 12b, 12c, 12d, 12e may be comprised of metal nitrides, such as tantalum nitride (TaN), titanium nitride (TiN), tungsten nitride (WN), and combinations thereof.

To electrically isolate the metal based interconnect structure 12a, 12b, 12c, 12d, 12e from the body of electrically conductive support material 14, an electrically insulating coating (not shown in FIGS. 1A and 1B for clarity purposes, but clearly depicted in FIGS. 2-8) is formed on the outer surfaces of the metal based interconnect structure 12a, 12b, 12c, 12d, 12e. The electrically insulating coating may be composed of a polymeric composition. In some embodiments, the electrically insulating coating may be provided by inorganic polymers; hybrid polymers; organic polymers such as imides, parylene, organosiloxanes, epoxies, acrylates, urethanes, poly(phenylene oxide), polyamide, polyester, PEEK, polyethelyene naphthalate, polyetherimide, fluoropolymers, or SiLK™. In one embodiment, the electrically insulating coating may be provided by an organic thermoset polymer, and/or a organo silicate glass. In other embodiments, the electrically insulating coating may be a dielectric, such as an oxide, nitride or oxynitride. In some examples, the electrically insulating coating may be silicon oxide ($SiO_2$), silicon nitride, aluminum oxide ($Al_2O_3$), hafnium oxide, hafnium silicon oxide, hafnium oxynitride and combinations thereof.

Referring to FIGS. 1A and 1B, the body of electrically conductive support material 14 that contains and supports the metal based interconnect structures 12a, 12b, 12c, 12d, 12e may be composed of any electrically conductive material that can provide substantial mechanical support for the metal wires of the metal based interconnect structures 12a, 12b, 12c, 12d, 12e. In some embodiments, the electrically conductive support material 14 is a metal selected from the group consisting of copper, tungsten, aluminum, platinum, silver, tantalum and combinations thereof. The electrically conductive support material 14 can be electrically grounded. By electrically grounding the electrically conductive support material 14, the signal integrity of all of the metal wires in the metal based interconnect structure 12a, 12b, 12c, 12d, 12e can be improved.

As noted above, the metal based interconnect structure 12a, 12b, 12c, 12d, 12e includes non-linear portions. Referring to the interposer 100A that is depicted in FIG. 1A, the metal based interconnect structures 12a may include angled portions. For example, linear line portions of the metal based interconnect structure 12a may intersect at orthogonal angles α1, as depicted in FIG. 1A. Orthogonal refers to right angles, i.e., angles of 90°. It is noted that this is only one example of the angle between intersecting linear portions of the metal based interconnect structures 12a. For example, in one embodiment, the angle α1 connecting intersecting liner portions of the metal based interconnect structures 12a may range from 15° to 85°. In other embodiments, the angle α1 connecting intersecting liner portions of the metal based interconnect structures 12a may range from 30° to 60°. In some examples, the angle α1 connecting intersecting liner portions of the metal based interconnect structures 12a may be equal to 15°, 20°, 25°, 30°, 35°, 45°, 55°, 60°, 65°, 70°, 75°, 80°, 85° and 90°.

Referring to the interposer 100B that is depicted in FIG. 1B, the metal based interconnect structures 12b, 12c, 12d, 12e may include curved portions. A curve is a line that is not straight. In some embodiments, the curvature of the metal line of the metal based interconnect structure is a single arc extending continuously from a first side to a second side of the dielectric base material as identified by reference number 12d. In another embodiment, the curvature of the metal based interconnect structure has multiple arcs, as depicted by the structures having reference numbers 12b, 12c, and 12e. For example, the curvature may be sigmoidal. In yet other embodiments, the curvature for the metal lines of the metal based interconnect structures may include a first arc at a first side of the body of the electrically conductive support material 14, and a second arc at a second side of the body of electrically conductive support material 14, wherein a linear portion of the metal based interconnect structure is present therebetween, as illustrated by the structure having reference number 12b.

It is noted that the angled structures that provide the metal based interconnect structures 12a in FIG. 1A, and the curved structures that provide the metal based interconnect structures 12b, 12c, 12d, 12e, may be employed simultaneously with linear metal lines in the same body of electrically conductive support material 14. For example, FIG. 1B illustrates linear metal lines identified by reference number 12f.

Although the structure depicted in FIGS. 1A and 1B, is an interposer, the methods and structures disclosed herein are equally applicable to other forms of interconnect structures, as well as printed circuit boards (PCBs) and components related to printed circuit boards (PCBs). Further details of the methods of the present disclosure are now discussed with greater detail with reference to FIGS. 2-8.

Figure 2:
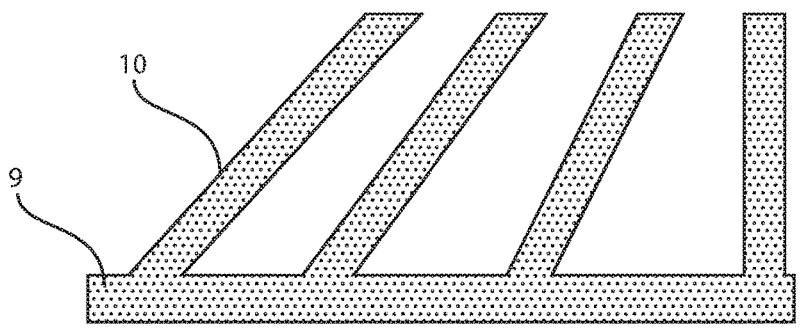
FIG. 2 is a side cross-sectional view depicting providing a sacrificial trace structure using an additive forming method, the sacrificial trace structure having a geometry for the interconnect, in accordance with one embodiment of the present disclosure.

FIG. 2 depicts providing a sacrificial trace structure 10 using an additive forming method. The term 'sacrificial' denotes a structure that facilitates the formation of a material layer within a final device structure, yet the sacrificial structure is not present in the final device structure. The sacrificial trace structure 10 provides a structure having a geometry, e.g., including lines having angles or curvatures, that provides the geometry of the later formed metal lines of the metal based interconnect structures, e.g., the structures identified by reference numbers 12a, 12b, 12c, 12d, 12e in FIGS. 1A and 1B.

Additive Manufacturing (AM) is an appropriate name to describe the technologies that build 3D objects by adding layer-upon-layer of material, whether the material is dielectric, plastic, metal, of semiconductor composition or combination thereof. The sacrificial trace structure 10 is formed using a three dimensional additive method selected from the group consisting of stereolithography, self-propagating waveguide formation, fused deposition modeling (FDM), selective laser sintering (SLS), continuous liquid interface production (CLIP), digital light processing (DLP), material jetting, and combinations thereof.

Stereolithography a technique or process for creating three-dimensional objects, in which a computer-controlled moving laser beam is used to build up the required structure, layer by layer, from a liquid polymer that hardens on contact with laser light. In some embodiments, a stereolithography technique provides a method to build a 3D microstructure in a layer-by-layer process, which can involve a platform (e.g., substrate) that is lowered into a photo-monomer bath in discrete steps. At each layer, a laser is used to scan over the area of the photo-monomer that is to be cured (i.e., polymerized) for that particular layer. Once the layer is cured, the platform is lowered by a specific amount (i.e., determined by the processing parameters and desired feature/surface resolution), and the process is repeated until the complete 3D structure is created.

Fused deposition modeling (FDM) is an additive manufacturing technology, which works on an "additive" principle by laying down material in layers; a plastic filament or metal wire is unwound from a coil and supplies material to produce a part. In some embodiments, FDM builds parts up layer-by-layer by heating and extruding thermoplastic filament.

Self-propagating waveguide formation typically includes the use of a polymer foam, or other cellular material. Self-propagating waveguide may for ordered open cellular polymer materials with micro-lattice structures and features. These materials can be formed by exposing a two-dimensional mask with a pattern of circular apertures that is covering a reservoir containing a photomonomer. More specifically, collimated UV light can be used to expose liquid polymer through a mask to form polymer waveguide. Within the photomonomer, self-propagating photopolymer waveguides originate at each aperture in the direction of the UV collimated beam and polymerize together at points of intersection. By simultaneously forming an interconnected array of these fibers in three-dimensions and removing the uncured monomer, three-dimensional lattice-based open-cellular polymer materials can be fabricated, In one embodiments, the sacrificial trace structure 10 is comprised of a polymeric material. When the sacrificial trace structure 10 is formed using stereolithography, the sacrificial trace structure 10 can be composed of a photo-hardenable resin compositions comprises of at least one photo-polymerizable compound, such as a photo-polymerizable modified urethane (meth)acrylate compound, an oligoester acrylate compound, an epoxyacrylate compound, an epoxy compound, a polyimide compound, an aminoalkyd compound, and a vinyl ether compound, as a main component, and a photosensitive polymerization initiator. When the sacrificial trace structure 10 is formed using FDM, the sacrificial trace structure 10 can be composed of Acrylonitrile Butadiene Styrene ABS, Polylactic acid PLA, Polycarbonate PC, Polyamide PA, Polystyrene PS, Polyether ether ketone PEEK, lignin, rubber, and combinations thereof. When the sacrificial trace structure 10 is formed using self-propagating waveguide formation, the sacrificial trace structure 10 may be composed of thiol-ene polymer.

It is noted that the above compositions for the sacrificial trace structure 10 and additive manufacturing processes are provided for illustrative purposes and are not intended to limit the disclosed methods and structures to only the above examples. For example, in addition to the above examples, the sacrificial trace structure 10 may also be formed using wire or textile layup, modular assembly, deformed perforated sheet lattice assembly, as well as other three dimensional additive methods.

Although the sacrificial trace structure 10 is depicted as having linear metal line portions, the sacrificial trace structure may include non-linear metal line portions, e.g., angled portions and curved portions, to provide metal interconnect structures similar to the non-linear metal lines of the metal interconnect structures 12a, 12b, 12c, 12d, 12e as depicted in FIGS. 1A and 1B.

Figure 3:
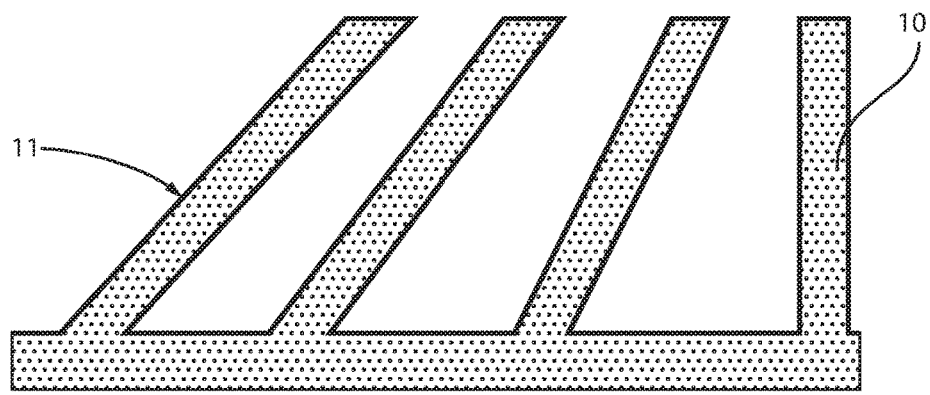
FIG. 3 is a side cross-sectional view depicting forming a continuous seed metal layer on the sacrificial trace structure, in accordance with one embodiment of the present disclosure.

FIG. 3 depicts one embodiment of forming a continuous seed metal layer 11 on the sacrificial trace structure 10. The continuous seed metal layer 11 may be composed of any metal, such as nickel, copper, aluminum, tungsten, titanium, platinum, gold, silver, and combinations thereof. The thickness of the continuous seed metal layer 11 is selected to provide a seed layer for subsequent metal depositions, and have a thickness that is suitable to not be removed during the process step for removing the sacrificial trace structure 10.

The continuous seed metal layer 10 is a deposited metal layer having a conformal thickness. The term "conformal" denotes a layer having a thickness that does not deviate from greater than or less than 30% of an average value for the thickness of the layer. By continuous it is meant that the continuous seed metal layer 10 is free of breaks.

The continuous seed metal layer 11 may be deposited using a physical vapor deposition (PVD) process. For example, the continuous seed metal layer 11 may be composed of nickel deposited using electroless plating. Electroless nickel plating (EN) is an auto-catalytic chemical technique used to deposit a layer of nickel-phosphorus or nickel-boron alloy. The process may employ a reducing agent, e.g., hydrated sodium hypophosphite ($NaPO_2H_2.H_2O$) which reacts with the metal ions to deposit metal. In other embodiments, the continuous seed metal layer 11 may be formed using electroplating and/or sputtering. In other embodiments, the continuous seed metal layer 11 may be formed using atomic layer deposition (ALD) or chemical vapor deposition (CVD), e.g., plasma enhanced chemical vapor deposition (PECVD). The thickness of the continuous seed metal layer 11 may have a thickness ranging from 5 nm to 100 nm. In another embodiment, the thickness of the continuous seed metal layer 11 may range from 10 nm to 50 nm. In some embodiments, the polymeric base material 9 may facilitate uniformity in the deposition of the continuous seed metal layer 11 on the portions of the sacrificial trace structure 10 that subsequently provide the metal lines of the metal interconnect structure of the interposer.

It is noted that in some embodiments a block mask may be formed atop a portion of the sacrificial trace structure 10 prior to forming the continuous seed metal layer 11 to select which portions of the sacrificial trace structure 10 may be coated with the continuous seed metal layer 11.

Figure 4:
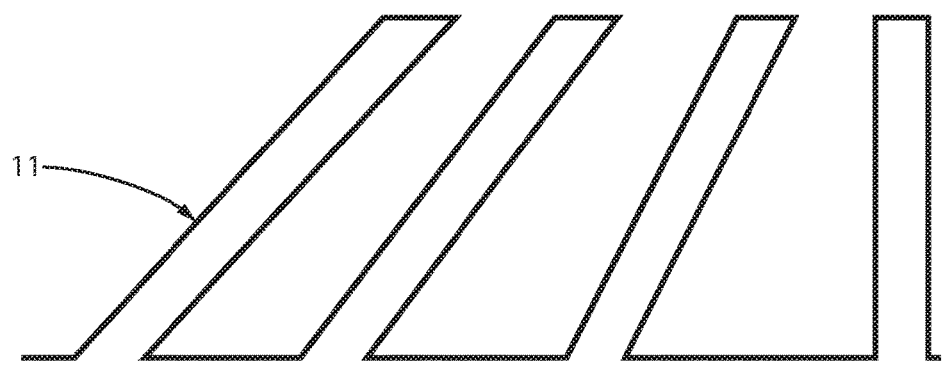
FIG. 4 is a side cross-sectional view depicting one embodiment of removing the sacrificial trace structure, wherein the continuous seed metal layer remains, in accordance with one embodiment of the present disclosure.

FIG. 4 depicts one embodiment of removing the sacrificial trace structure 10, wherein the continuous seed metal layer 11 remains. In some embodiments, the sacrificial trace structure 10 may be removed by an etch process that is selective to the continuous seed metal layer 11. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The selective etch process may be a wet chemical etch or a dry etch.

Figure 5:
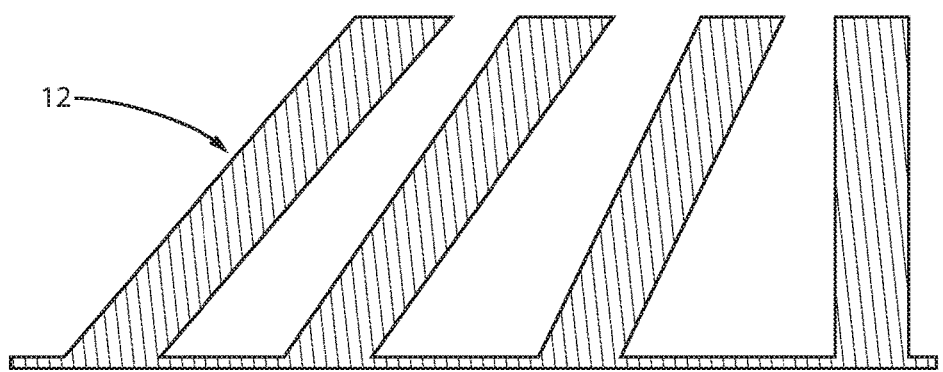
FIG. 5 is a side cross-sectional view depicting one embodiment of forming an interconnect metal layer on the continuous seed layer, wherein the interconnect metal layer is hollow.

FIG. 5 illustrates one embodiment of forming an interconnect metal layer 12 on the continuous seed metal layer 11. In one embodiment, the interconnect metal layer 12 may be deposited directly on the continuous seed metal layer 11 at a thickness that provides metal lines for the interconnect metal layer 12 that are hollow (not shown). In another embodiment, the interconnect metal layer 12 is deposited directly on the continuous metal seed layer 11 at a thickness to provide solid metal lines for the interconnect metal layer 12 of the interposer, as depicted in FIG. 5.

The interconnect metal layer 12 may be composed of any metal, such as the metal being deposited provides an electrically conductive material. For example, the interconnect metal layer 12 may be composed of copper, nickel, aluminum, titanium, tungsten, tantalum, platinum, gold, silver and combinations thereof. In some embodiments, the interconnect metal layer 12 may be deposited using a physical vapor deposition (PVD) method, such as plating, electroless plating, electroplating, sputtering and combinations thereof. In one embodiment, the interconnect metal layer 12 is formed composed of copper deposited using electroplating. One example of a plating bath composition that is suitable for electroplating the interconnect metal layer 12 of copper may include a copper sulfate ($CuSO_4$) solution with sulfuric acid ($H_2SO_4$). In some embodiments, electroless deposition of copper (Cu) may rely on the presence of a reducing agent, for example formaldehyde (HCHO), which reacts with the copper (Cu) metal ions to deposit the metal. In some other embodiments, the metal for the interconnect metal layer 12 may be deposited using a chemical vapor deposition (CVD) process, such as plasma enhanced chemical vapor deposition (PECVD) and metal organic chemical vapor deposition (MOCVD). In yet other embodiments, the metal for the interconnect metal layer 12 may be deposited using atomic layer deposition (ALD).

Figure 6:
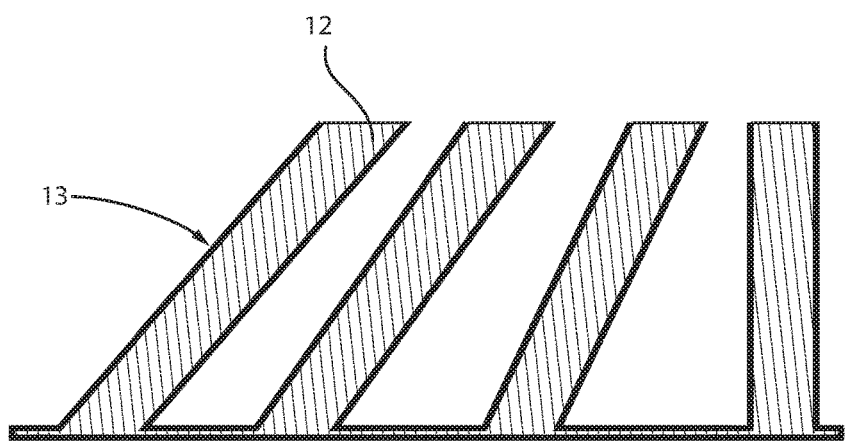
FIG. 6 is a side cross-sectional view depicting an electrically insulating material layer being formed on the interconnect metal layer, in accordance with one embodiment of the present disclosure.

FIG. 6 depicts an electrically insulating material layer 13 being formed on the interconnect metal layer 12. The electrically insulating material layer 13 is formed on the outer surfaces of the metal based interconnect structure 12 to electrically isolate the metal based interconnect structure 12 from the subsequently formed body of the electrically conductive support material 14. The electrically insulating layer 13 may be composed of a polymeric composition. In some embodiments, the electrically insulating layer 13 may be provided by inorganic polymers; hybrid polymers; and/or organic polymers, such as polyimides, parylene, organosiloxanes, epoxies, acrylates, urethanes, poly(phenylene oxide), polyamide, polyester, PEEK, polyethelyene naphthalate, polyetherimide, fluoropolymers, or SiLK™. In one embodiment, the electrically insulating layer 13 may be provided by an organic thermoset polymer, and/or a organo silicate glass. In other embodiments, the electrically insulating layer 13 may be a dielectric, such as an oxide, nitride or oxynitride. In some examples, the electrically insulating layer 13 may be silicon oxide ($SiO_2$), silicon nitride, aluminum oxide ($Al_2O_3$), hafnium oxide, hafnium silicon oxide, hafnium oxynitride and combinations thereof.

The electrically insulating layer 13 may be deposited using a conformal deposition process. For example, the electrically insulating layer 13 may be deposited using chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In other embodiments, the electrically insulating layer 13 may be deposited using spin on deposition, dip coating, spray coating, and chemical solution deposition.

Figure 7:
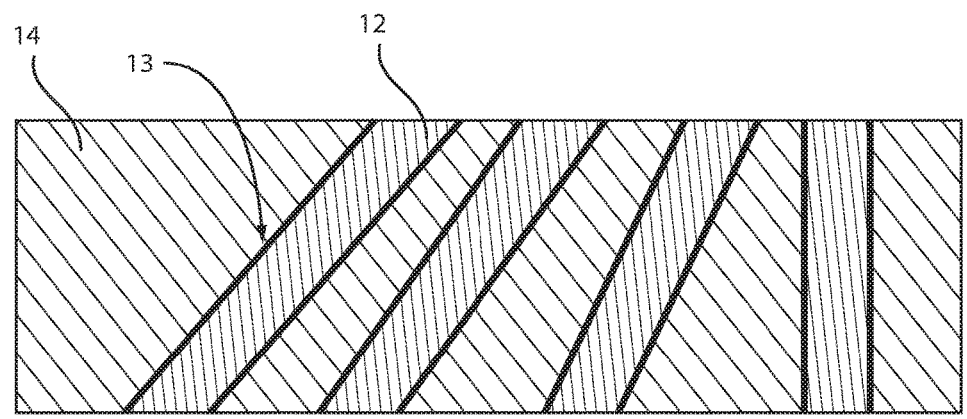
FIG. 7 is a side cross-sectional view depicting an electrically conductive support material that is deposited to encapsulate a majority of the interconnect metal layer, in accordance with one embodiment of the present disclosure.

FIG. 7 depicts one embodiment of an electrically conductive support material 14 that is deposited to encapsulate a majority of the interconnect metal layer 12. The electrically conductive support material 14 may also be thermally conductive. In some embodiments, because the electrically conductive support material 14 is also thermally conductive, the support material functions as a heat sink to dissipate heat produced by the interconnects.

In some embodiments, the electrically conductive support material 14 is a metal selected from the group consisting of copper, tungsten, aluminum, platinum, silver, tantalum and combinations thereof. The electrically conductive support material 14 is deposited directly on the electrically insulating layer 13 to fill the entirety of the spaces between the metal wires in the interconnect metal layer 12. The electrically conductive support material 14 may be deposited using physical vapor deposition (PVD). Examples of PVD suitable for depositing the electrically conductive support material 14 may include plating, electroplating, electroless plating, sputtering and combinations thereof. The electrically conductive support material 14 may also be deposited using chemical vapor deposition (CVD), such as plasma enhanced chemical vapor deposition (PECVD) or metal organic chemical vapor deposition (MOCVD).

FIG. 7 also depicts planarizing the opposing sidewalls of the electrically conductive support material 14, in which the planarizing exposes the ends of the interconnect metal layers 12 so that the interconnect metal lines extend through the body of the electrically conductive support material 14. By exposing the ends of the interconnect metal layers 12, the planarizing step exposes points on the interconnect metal layer 12 for being engaged in electrical communication to the structures that are engaged to the interposer. The planarization process may be provided by grinding, chemical mechanical planarization (CMP) or a combination thereof.

Figure 8:
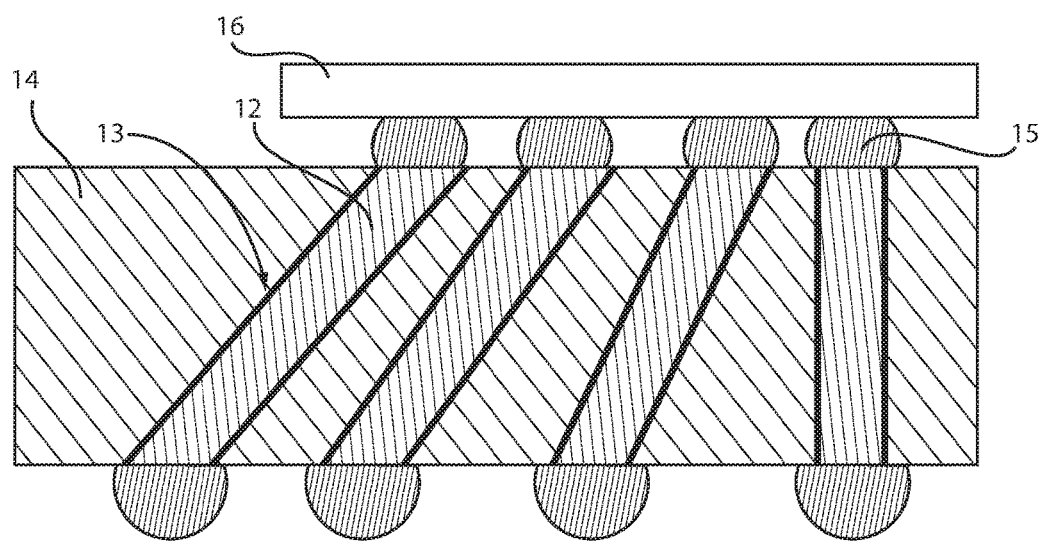
FIG. 8 is a side cross-sectional view depicting solder bump processing of the structure depicted in FIG. 7.

FIG. 8 depicts solder bump processing of the structure depicted in FIG. 7. Solder bumps (also referred to as "solder balls"), such as C4 (controlled collapse chip connection) bumps, have been used to bond a chip to a chip carrier or to a chip to an interposer and then bond the interposer to the chip carrier. The solder bumps/solder balls 15 are formed on the exposed ends of the metal wires that provide the metal interconnect structure 12. The term "solder", as used herein, refers to any metal or metallic compound or alloy that is melted and then allowed to cool in order to join two or more metallic surfaces together. Generally speaking, solders have melting temperatures in the range of 150° C. to 250° C. Solder bumps may be small spheres of solder (solder balls) that are bonded to contact areas, interconnect lines or pads of semiconductor devices. In some embodiments, the solder bumps can be made from lead-free solder mixtures or lead tin solder. The solder bumps 15 may be deposited using injection molding soldering (IMS) or sputtering. In FIG. 8 the structure identified by reference number 16 may be a microprocessor chip.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming an interconnect comprising:
providing a sacrificial trace structure using an additive forming method, the sacrificial trace structure having a geometry for the interconnect having at least one curved portion;
forming a continuous seed metal layer on the sacrificial trace structure;
removing the sacrificial trace structure, wherein the continuous seed metal layer remains;
forming an interconnect metal layer on the continuous seed metal layer, the interconnect metal layer having the at least one curved portion;
forming an electrically insulating material layer on the interconnect metal layer; and
forming an electrically conductive support material to encapsulate a majority of the interconnect metal layer, wherein the electrically insulating material layer isolates the interconnect metal layer from the electrically conductive support material, wherein ends of the interconnect metal layer are exposed through opposing surfaces of the electrically conductive support material to provide said interconnect extending through said electrically conductive support material.

2. The method of claim 1, wherein the electrically conductive support material is grounded.

3. The method of claim 1, wherein the sacrificial trace structure is comprised of a polymeric material.

4. The method of claim 1, wherein the sacrificial trace structure is formed using a three-dimensional additive method selected from the group consisting of stereolithography, self-propagating waveguide formation, fused deposition modeling (FDM), selective laser sintering (SLS), continuous liquid interface production (CLIP), digital light processing (DLP), material jetting, and combinations thereof.

5. The method of claim 3, wherein the continuous seed metal layer is composed of a metal selected from the group consisting of nickel, aluminum, copper, tantalum, titanium, platinum, gold, tin and combinations thereof.

6. The method of claim 1, wherein removing the sacrificial trace structure comprises dissolving polymeric material of the sacrificial trace structure.

7. The method of claim 1, wherein the interconnect metal layer is composed of a metal selected from the group consisting of nickel, aluminum, copper, tantalum, titanium, platinum, gold, tin and combinations thereof.

8. The method of claim 7, wherein the interconnect composed of the interconnect metal layer and the continuous seed metal layer have a solid core.

9. The method of claim 7, wherein the interconnect composed of the interconnect metal layer and the continuous seed metal layer have a hollow core.

10. The method of claim 1, wherein the electrically insulating material layer is a dielectric comprising an oxide, nitride or oxynitride formed by chemical vapor deposition or thermal growth processing.

11. The method of claim 1, wherein the electrically insulating material layer is a dielectric comprising a polymeric composition.

12. The method of claim 1, wherein the electrically conductive support material is a metal selected from the group consisting of copper, tungsten, aluminum, platinum, silver, tantalum, gold, tin and combinations thereof.

13. The method of claim 1, wherein said forming the electrically conductive support material comprises:
   physical vapor deposition or chemical vapor deposition of the electrically conductive support material; and
   planarization of the electrically conductive support material to expose said ends of said interconnect metal layer.

14. A method of forming an interconnect comprising:
   providing a sacrificial trace structure using an additive forming method, the sacrificial trace structure having a geometry for the interconnect having a substantially uniform width and at least one non-linear portion provided by an angle in the interconnect;
   forming a continuous seed metal layer on the sacrificial trace structure; removing the sacrificial trace structure, wherein the continuous seed metal layer remains; forming an interconnect metal layer on the continuous seed metal layer, the interconnect metal layer having said substantially uniform width and said at least one non-linear portion provided by said angle in the interconnect;
   forming an electrically insulating material layer on the interconnect metal layer; and
   forming an electrically conductive support material to encapsulate a majority of the interconnect metal layer, wherein the electrically insulating material layer isolates the interconnect metal layer from the electrically conductive support material, wherein ends of the interconnect metal layer are exposed through opposing surfaces of the electrically conductive support material to provide said interconnect having said at least one non-linear portion extending through said electrically conductive support material.

* * * * *